United States Patent
Salatandre (10) Patent No.: US 11,122,703 B2
(45) Date of Patent: Sep. 14, 2021

(54) ELECTRONIC MEDIA PRODUCTION SYSTEM AND SYSTEM FOR USE THEREWITH

(71) Applicant: Edgar Davin Salatandre, Toronto (CA)

(72) Inventor: Edgar Davin Salatandre, Toronto (CA)

( * ) Notice: Subject to any disclaimer, the term of this patent is extended or adjusted under 35 U.S.C. 154(b) by 0 days.

(21) Appl. No.: 14/592,575

(22) Filed: Jan. 8, 2015

(65) Prior Publication Data

US 2015/0116953 A1 Apr. 30, 2015

Related U.S. Application Data

(63) Continuation of application No. 13/285,862, filed on Oct. 31, 2011, now Pat. No. 8,964,397.

(51) Int. Cl.
| | |
|---|---|
| *H05K 7/00* | (2006.01) |
| *B42D 15/02* | (2006.01) |
| *B42D 3/12* | (2006.01) |
| *G10L 25/48* | (2013.01) |
| *H04R 1/06* | (2006.01) |

(52) U.S. Cl.
CPC .............. *H05K 7/00* (2013.01); *B42D 3/123* (2013.01); *B42D 15/022* (2013.01); *G10L 25/48* (2013.01); *H04R 1/06* (2013.01); *Y10T 29/49002* (2015.01)

(58) Field of Classification Search
CPC ........ B42D 15/022; B42D 3/123; H05K 7/02; H05K 7/026; H05K 7/10; H05K 7/1465; G06F 1/1656
USPC ................................ 361/728–730; 40/124.03
See application file for complete search history.

(56) References Cited

U.S. PATENT DOCUMENTS

| | | | |
|---|---|---|---|
| 6,253,183 B1 | 6/2001 | Boucard | |
| 6,614,121 B1* | 9/2003 | Heenan | ................. H01L 25/105 257/686 |
| 7,436,318 B2 | 10/2008 | Affolter et al. | |
| 8,011,122 B2 | 9/2011 | Clegg et al. | |
| 2005/0174252 A1* | 8/2005 | Hsieh | ................... B42D 15/022 340/692 |
| 2005/0194434 A1 | 9/2005 | Trent | |
| 2009/0211126 A1 | 8/2009 | Oh | |
| 2009/0314668 A1 | 12/2009 | Miller et al. | |
| 2010/0307035 A1 | 12/2010 | Lien et al. | |

(Continued)

*Primary Examiner* — James Wu
*Assistant Examiner* — Christopher L Augustin
(74) *Attorney, Agent, or Firm* — Head, Johnson, Kachigian & Wilkinson, PC (57) ABSTRACT

A system comprising modules. Each module includes: a presentation system including one or more of a speaker and a video screen; and a port. In use, if the presentation system includes the speaker, the system produces sounds derived from data obtained via the port. If the presentation system includes the screen, the system displays images derived from data obtained via the port. The module can also include connectors and the system can also include actuators. Each actuator, in use, can be coupled without soldering to a connector, and the presentation system of each module can operate in response to the actuator or actuators coupled to said each module. The system can also include data storage devices, each adapted to be releasably coupled to a respective port, and the port can be selected from: microchip socket and USB port. The system can be used as part of a method.

11 Claims, 6 Drawing Sheets

(56) References Cited

U.S. PATENT DOCUMENTS

| | | | | |
|---|---|---|---|---|
| 2012/0000100 A1* | 1/2012 | Jin | ............................ | A63H 5/00 40/124.02 |
| 2013/0125429 A1* | 5/2013 | Flesher | ................ | B42D 15/022 40/124.03 |

* cited by examiner

ELECTRONIC MEDIA PRODUCTION SYSTEM AND SYSTEM FOR USE THEREWITH

CROSS-REFERENCE TO PENDING APPLICATIONS

This application is a continuation application of U.S. patent application Ser. No. 13/285,862 filed Oct. 31, 2011 entitled "Electronic Media Production System and System for use Therewith," which is hereby incorporated by reference in its entirety.

BACKGROUND OF THE INVENTION

1. Field of the Invention

The present invention relates to the field of electronic media devices, such as shelf-talkers, video shelf-talkers, audio greeting cards, talking presentation folders, talking business cards, video presentation folders and video brochures.

2. Background of the Invention

A popular form of merchandising involves the production of electronic media devices. These devices take many forms, including but not limited to:

| | |
|---|---|
| shelf talker | a device intended for placement at a retail display and which delivers audio through a speaker, typically in response to nearby movement or selection of a contact (i.e. push-button) switch |
| video shelf talker | a device intended for placement at a retail display and which delivers an audiovisual presentation through a speaker and screen, typically in response to nearby movement or selection of a contact switch |
| audio greeting card | a greeting card which delivers audio through a speaker, typically initiated when the card is opened |
| talking presentation folder | a presentation folder which delivers audio through a speaker, typically initiated when the folder is opened |
| talking business card | a business card which delivers audio through a speaker, typically in response to selection of a contact switch |
| video presentation folder | a presentation folder which delivers an audiovisual presentation through a speaker and screen, typically initiated when the folder is opened |
| video brochure | a brochure which delivers an audiovisual presentation through a speaker and screen, typically initiated when the folder is opened or in response to selection of a contact switch |

These devices are used by persons in many industries, most of whom lack the technical skills to construct such devices. Thus, there exists an industry dedicated to the production of these devices for others.

The typical modus operandi of this industry involves:
maintaining an inventory of components including:

| | |
|---|---|
| motherboards | contact switches |
| speakers | pressure switches |
| video screens (typically 15 LCD) | vibration sensors |
| magnet switches | sound sensors |
| motion sensors | microphones |
| light sensors | lights | receiving orders for electronics devices
meeting the orders by selecting appropriate components from the inventory and soldering them together into an assembly; and
fitting the assemblies into appropriate housings [folders, plastic cases, book spines, etc.] to produce the devices.

The construction of the devices is generally done in low-cost jurisdictions, as cost is often a critical factor.

As a result, in high-cost jurisdictions, this industry is characterized by relatively long production lead times.

SUMMARY OF THE INVENTION

An electronic media production system forms one aspect of the invention and comprises modules and actuators. Each module includes: a presentation system including one or more of a speaker and a video screen; a port; and one or more connectors. Each actuator, in use, is coupled without soldering to a respective connector. In use, the presentation system of each module operates in response to the actuator or actuators coupled to said each module, the presentation system: if the presentation system includes the speaker, producing sounds derived from data obtained via the port; and, if the presentation system includes the video screen, displaying images derived from data obtained via the port.

According to another aspect of the invention, the port can be selected from: microchip socket and Universal Serial Bus (USB) port.

According to another aspect of the invention, each connector can be adapted for a connection of the type selected from: pin-socket, blade, crimp-on, terminal block and insulation displacement.

According to another aspect of the invention, the actuators can include one or more of: magnet switches, motion sensors, light sensors, contact switches, pressure switches, vibration sensors and sound sensors.

According to another aspect of the invention, the system can further comprises microphones, each microphone, in use, being coupled without soldering and by a respective connector, to the module of which said respective connector forms part. In use, in respect of any module to which a microphone is coupled, sounds are collected by that microphone in response to data obtained via the port of said module.

According to another aspect of the invention, the system further comprises lights, each light, in use, being coupled without soldering and by a respective connector, to the module of which said respective connector forms part. In use, in respect of any module to which a light is coupled, the light is activated in response to data obtained via the port of said module.

According to another aspect of the invention, the microchip socket can be selected from One-Time Programming (OTP) sound chip socket and Serial Peripheral Interface (SPI) flash chip socket.

According to another aspect of the invention, the module can further comprise a battery from which the presentation system receives power in use.

According to another aspect of the invention, the presentation system can consist of a speaker.

According to another aspect of the invention, the presentation system can consist of a speaker and a video screen.

According to other aspects of the invention, the system can be embodied in a shelf-talker, video shelf-talker, audio greeting card, talking presentation folder, talking business card, video presentation folder or video brochure.

Forming yet another aspect of the invention is a method. The method comprises the steps of: maintaining an inventory of the components of the system; receiving orders for electronics devices; and meeting the orders by selecting appropriate components from the inventory and operatively combining them to produce the devices.

Forming yet another aspect of the invention is an electronic media production system comprising modules. Each module includes: a presentation system including one or more of a speaker and a video screen; and a port. In use: if the presentation system includes the speaker, the system produces sounds derived from data obtained via the port; and if the presentation system includes the video screen, the system displays images derived from data obtained via the port.

According to other aspects, the system can further comprise data storage devices, each adapted to be releasably coupled to a respective port, and the port can be selected from microchip socket and USB port.

Other advantages, features and characteristics of the present invention will become apparent upon consideration of the following detailed description and the appended claims with reference to the accompanying drawings, the latter being briefly described hereinafter.

DETAILED DESCRIPTION OF THE PREFERRED EMBODIMENT

Figure 1:
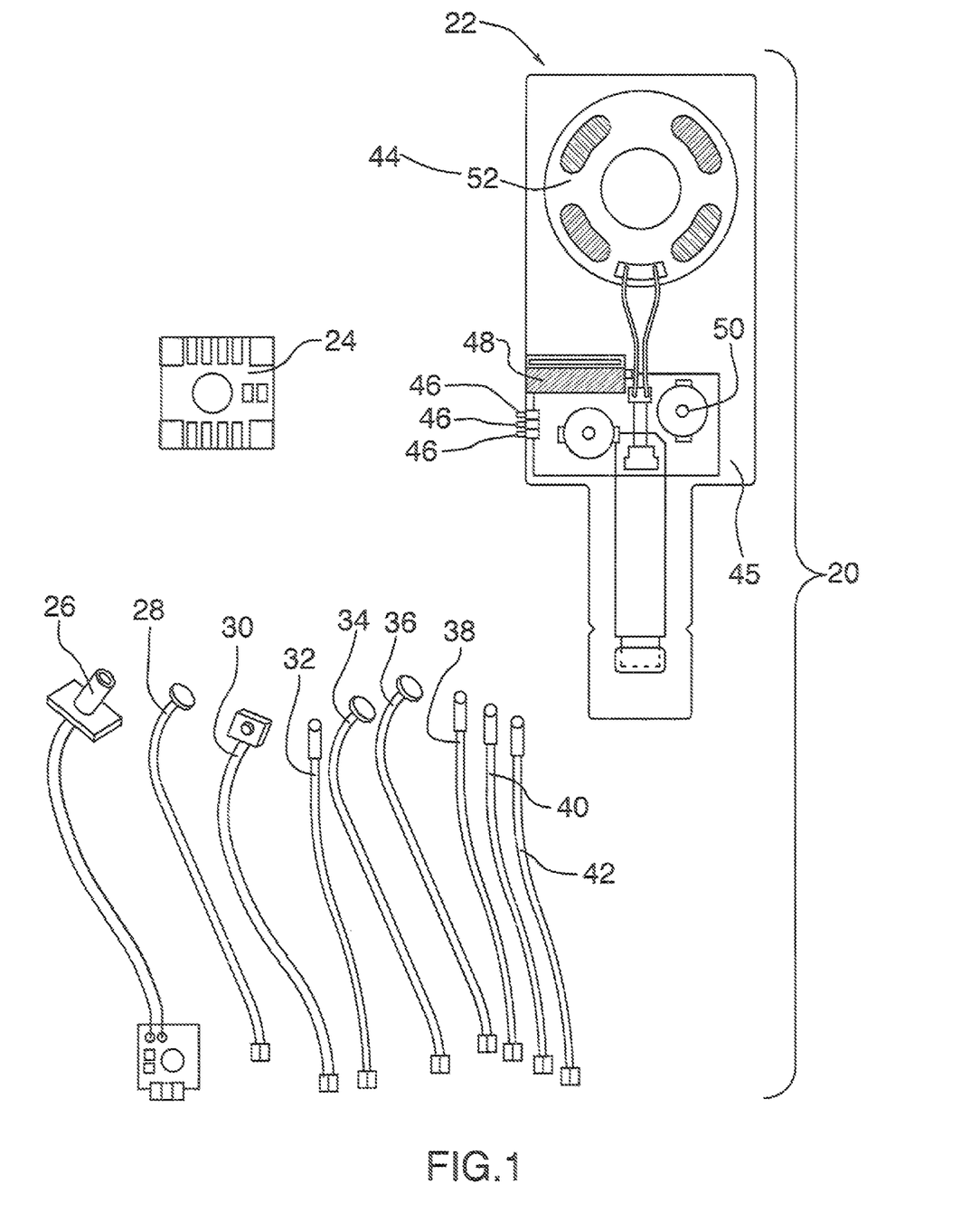
FIG. 1 is a view of the components of a system according to an exemplary embodiment of the invention.

Reference is now made to FIG. 1, wherein it will be seen that the components of an exemplary embodiment of the electronic media production system 20 comprise a module 22, a data storage device 24, actuators 26, 28, 30, 32, 34, 38, 40, microphones 36 and LED lights 42.

The module 22 includes a presentation system 44, a controller 45, a plurality of connectors 46, a port 48 and a battery 50. The presentation system 44 includes a speaker 52. The controller is a motherboard 45 coupled to the speaker 52. The connectors 46 are male ends of pin-type connectors and are coupled to the controller 45. The port 48 is an OTP chip socket and is coupled to the controller 45. The battery 50 is an alkaline cell coupled to the controller 45.

The data storage devices 24 is a conventional OTP sound chip adapted to be received by the port 48.

The actuators include magnet switches 34, motion sensors 26, light sensors 28, contact switches 30, pressure switches 40, vibration sensors 32 and sound sensors 38, and each terminate in a female end of a pin-type connector.

The microphones 36 and lights 42 also each terminate in a female end of a pin-type connector.

The system 20 can be used by a business as part of a method for producing electronic media products.

To carry out the method, the business will maintain an inventory of the components of the system. Upon receipt of an order for a particular type of device, the business can meet the orders by selecting appropriate components from the inventory and operatively combining them to produce the devices. The combination merely requires:
  programming the OTP chips, such that the completed device operates in the desired manner [i.e. activates the lights, captures sounds via the microphone and/or activates the presentation system in response to signals generated by the various actuators]
  fitting the ends of the various actuators, lights and/or microphones onto the connectors
  fitting the programmed OTP chips into the ports; and
  fitting the modules into appropriate housings, such as folders, in the case of brochures By way of example, only, if a customer desires an audio greeting card with the capacity to play a message on demand, the business may choose to secure a contact switch type actuator to the module and program and install the OTP chip such that activation of the switch causes playback of a pre-recorded message.

Persons of ordinary skill in the art understand the manner in which OTP chips can be programmed for this purpose. Accordingly, a detailed description of the above is neither required nor provided.

It will be evident that this system allows for relatively quick turnaround of electronics products in relatively high cost labor jurisdictions at relatively low cost. It will be evident, in turn, that this can be of significant advantage, for example, to small-to-medium businesses that need, on a short production lead time, relatively small volumes of custom electronics devices for promotions and the like. Examples of the modules that can be produced according to the invention include the shelf talker module 100, video shelf-talker module 102, audio greeting card module 104, talking presentation folder module 106, talking business card module 108, video presentation folder module 110 and video brochure module 112 shown in FIGS. 3 through 9.

Figure 2:
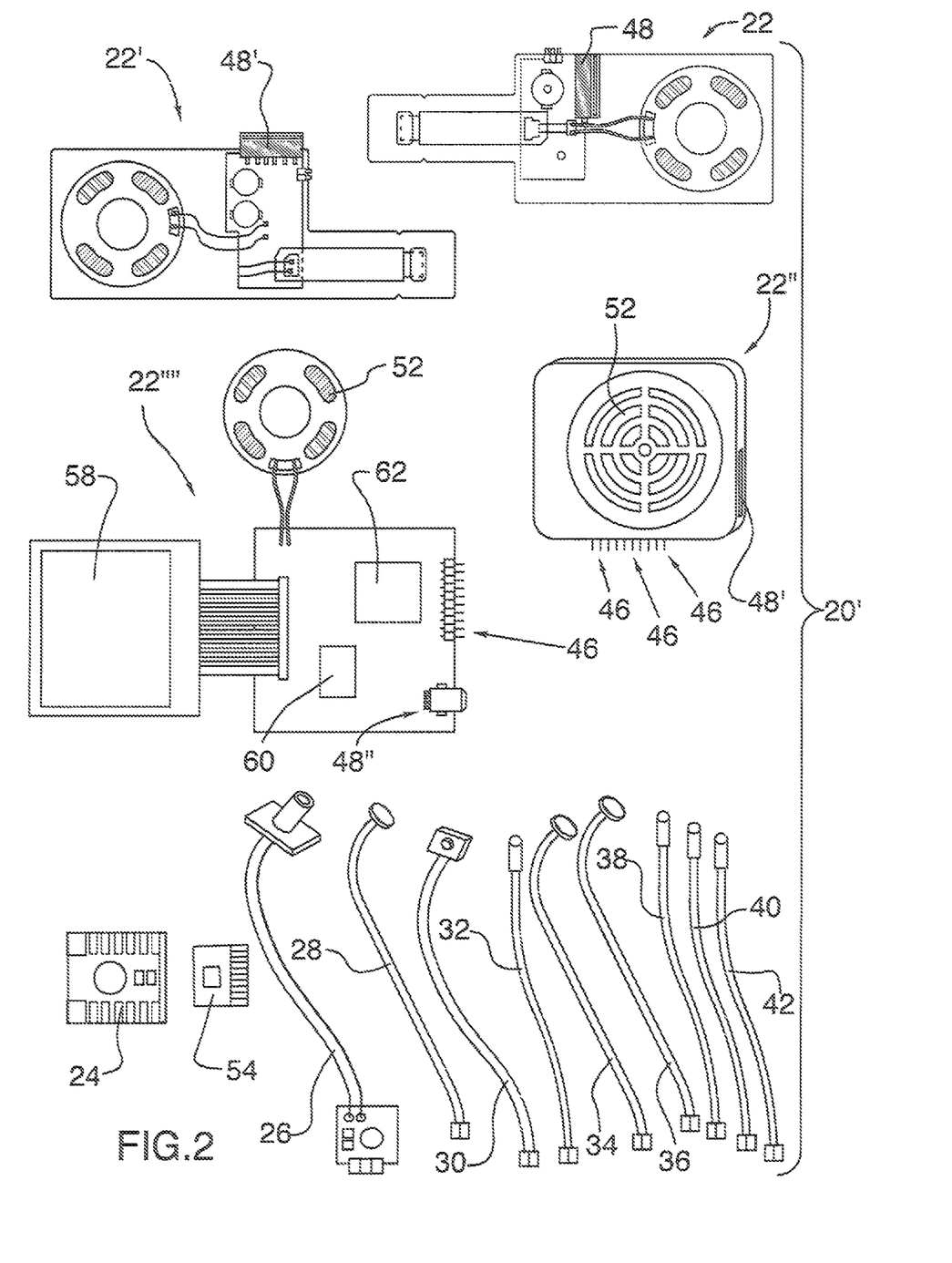
FIG. 2 is a view of the components of a system according to another exemplary embodiment of the invention.
Figure 3:
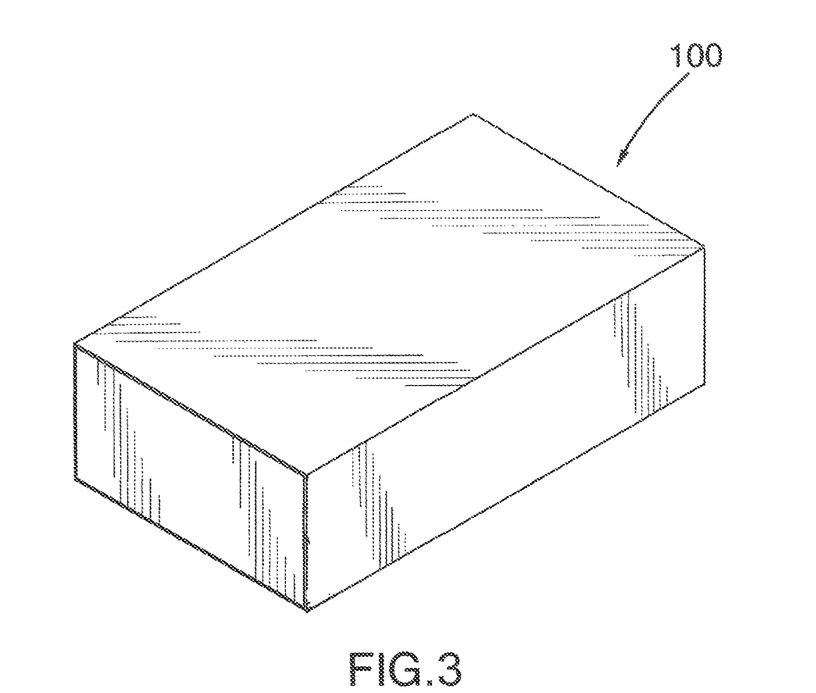
FIG. 3 is a perspective view showing a shelf talker module.
Figure 4:
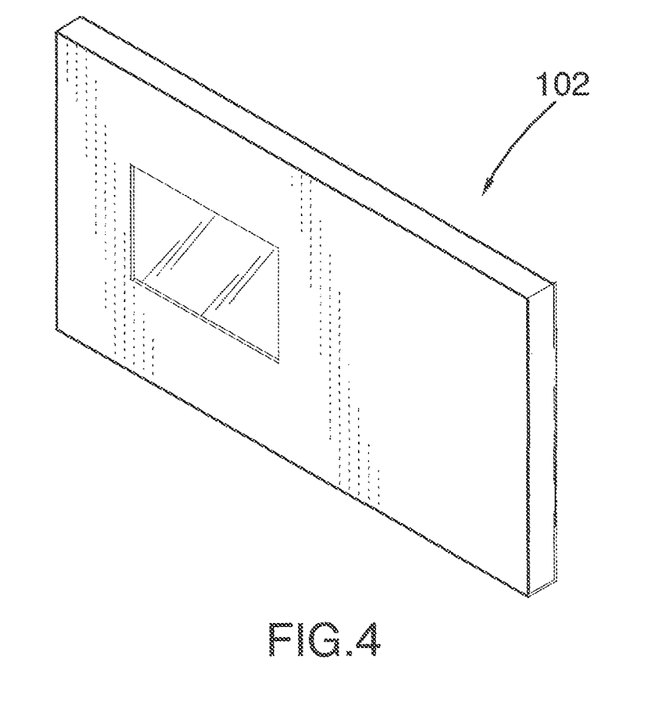
FIG. 4 is a perspective view showing a video shelf talker module.
Figure 5:
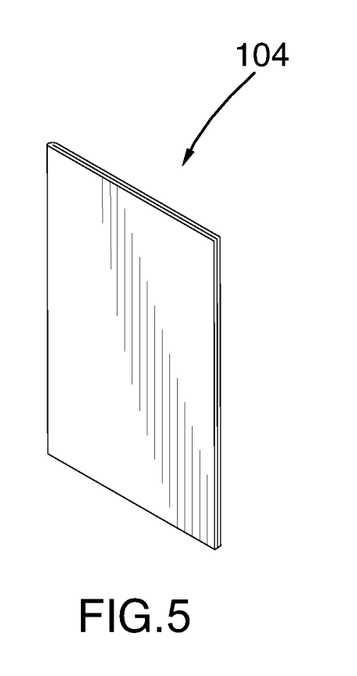
FIG. 5 is a perspective view showing an audio greeting card module.
Figure 6:
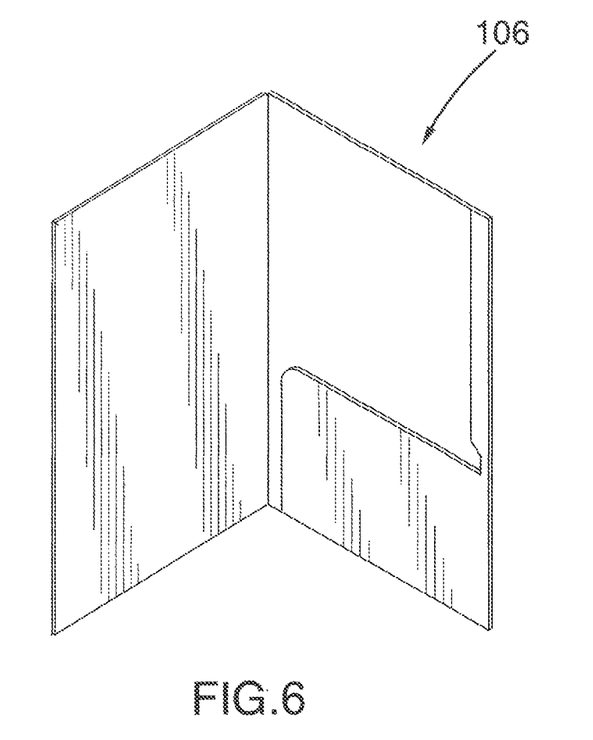
FIG. 6 is a perspective view showing a talking presentation folder module.
Figure 7:
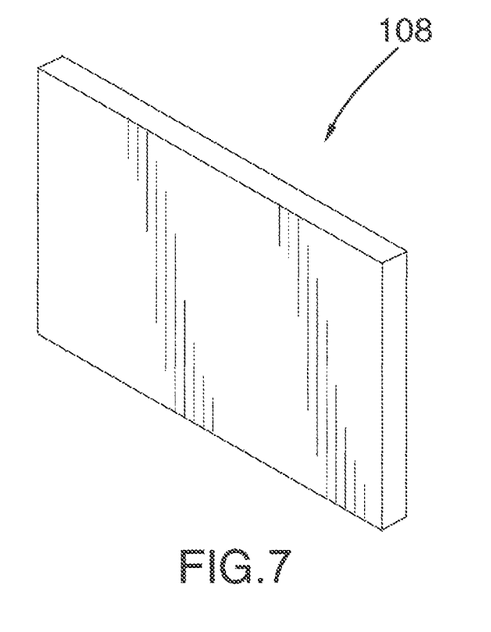
FIG. 7 is a perspective view showing a talking business card module.
Figure 8:
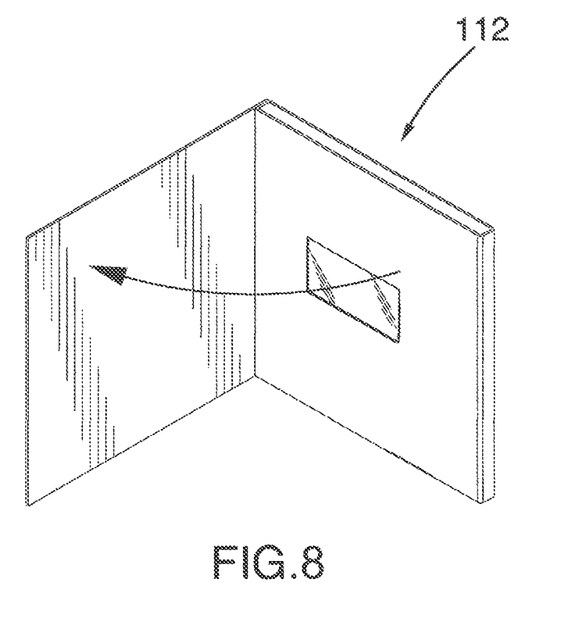
FIG. 8 is a perspective view showing a video presentation folder module.
Figure 9:
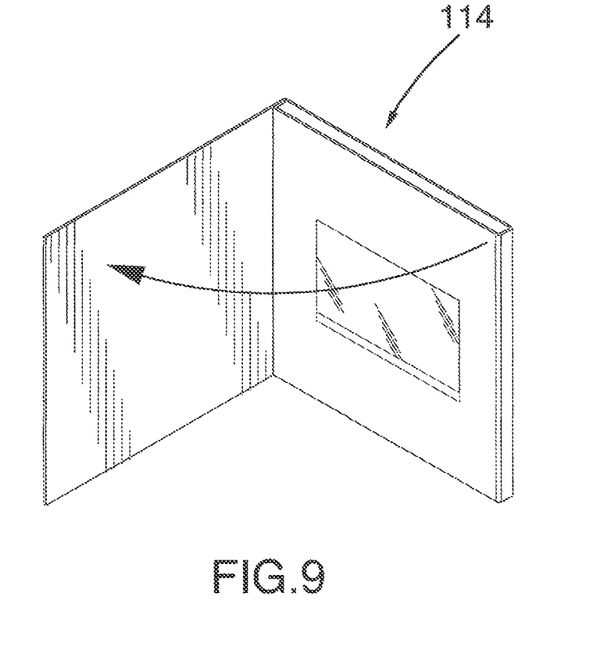
FIG. 9 is a perspective view showing a video brochure module.

Whereas a basic system is illustrated in FIG. 1, it will be evident that variations in the system are possible, as shown in FIG. 2, which shows a system 20' with more components and allowing greater flexibility.

In this drawing, a plurality of modules 22', 22" and 22' are shown in addition to the components previously described with reference to FIG. 1. Modules 22', 22" and 22' maintain the functionality of module 22 as shown in FIG. 1, namely, in the presence of a presentation system, a controller, at least one connector, a port and a battery, but differ slightly in deployment:
  module 22' is largely similar to module 22 but includes a chip socket 48' for an SPI flash memory chip 54
  module 22" is embodied as a shelf-talker wherein: the presentation system consists of a speaker 52; the port is again a chip socket 48' for an SPI flash memory; and a plurality of connectors 46 is provided
  module 22', which is suitable for use in a video book, includes a presentation system consisting of an LCD screen 58 and speaker 52. In this module 22', port 48" is defined by a USB port which permits information to loaded onto an flash memory chip 60 which forms part of the controller, the controller itself also including an integrated circuit 62

Further variations are possible.

For example, whereas in the illustrated embodiments, the connectors are defined by pin and socket type connectors, other connectors can be used, including but not limited to: blade, crimp-on, terminal block and insulation displacement.

As well, whereas OTP and SPI flash data storage is illustrated and described, this is not essential, and other types of memory could equally be employed.

Additionally, a battery is not required. For example, in the shelf-talker embodiment, these could be powered by low-voltage wiring present in the shelves. As well, although an alkaline cell is mentioned, lithium cells could be usefully employed, particularly in situations wherein the device is to rechargeable.

As well, it should be understood that, whereas it will at least sometimes be most appropriate for data [audio and/or video, as well as the algorithm used by the device to integrate the functionality of the actuators, microphone and/or lights] only, to be delivered via the port to the module, the circuitry necessary to drive the presentation system could also be placed at least in part on the data storage device chip.

Accordingly, the invention should be understood as limited only by the accompanying claims, purposively construed.

What is claimed is:

1. An electronic media production system comprising:
   modules, each including: a presentation system including one or more of a speaker and a video screen; a port; and one or more connectors; and
   actuators, each actuator, in use, being coupled without soldering to a respective connector,
   wherein, in use, the presentation system of each module operates in response to the actuator or actuators coupled to said each module, the presentation system:
   if the presentation system includes the speaker, producing sounds derived from data obtained via the port; and
   if the presentation system includes the video screen, displaying images derived from data obtained via the port;
   wherein each of said modules is chosen from the group consisting of: a shelf talker module, a video shelf talker module, an audio greeting card module, a talking presentation folder module, a talking business card module, a video presentation folder module, and a video brochure module.

2. The system according to claim 1, wherein the port is selected from: microchip socket and Universal Serial Bus (USB) port.

3. The system according to claim 1, wherein each connector is adapted for a connection of the type selected from: pin-socket, blade, crimp-on, terminal block and insulation displacement.

4. The system according to claim 1, wherein the actuators include one or more of: magnet switches, motion sensors, light sensors, contact switches, pressure switches, vibration sensors and sound sensors.

5. The system according to claim 1, wherein:
   the system further comprises microphones, each microphone, in use, being coupled without soldering and by a respective connector, to the module of which said respective connector forms part; and
   in use, in respect of any module to which a microphone is coupled, sounds are collected by that microphone in response to data obtained via the port of said module.

6. The system according to claim 1, wherein
   the system further comprises lights, each light, in use, being coupled without soldering and by a respective connector, to the module of which said respective connector forms part; and
   in use, in respect of any module to which a light is coupled, the light is activated in response to data obtained via the port of said module.

7. The system according to claim 2, wherein the microchip socket is selected from one-time programming (OTP) sound chip socket and serial peripheral interface (SPI) flash chip socket.

8. The system according to claim 1, wherein the module further comprises a battery from which the presentation system receives power in use.

9. A system according to claim 1, wherein the presentation system consists of a speaker.

10. A system according to claim 1, wherein the presentation system consist of a speaker and a video screen.

11. An electronic media production system for use with a chip having both memory and a controller, the system comprising:
    modules, each including: a presentation system including one or more of a speaker and a video screen; and a microchip socket port configured for releasably receiving the chip in a solderless connection, said microchip socket port selected from a one-time programming (OTP) sound chip socket and a serial peripheral interface (SPI) flash chip socket;
    wherein, in use,
    if the presentation system includes the speaker, the system produces sounds derived from data obtained via the port from the chip; and
    if the presentation system includes the video screen, the system displays images derived from data obtained via the port from the chip,
    wherein each of said modules is chosen from the group consisting of: a shelf talker module, a video shelf talker module, an audio greeting card module, a talking presentation folder module, a talking business card module, a video presentation folder module, and a video brochure module.

* * * * *